US010690920B2

(12) United States Patent
Cok et al.

(10) Patent No.: US 10,690,920 B2
(45) Date of Patent: Jun. 23, 2020

(54) DISPLAYS WITH TRANSPARENT BEZELS

(71) Applicant: X-Celeprint Limited, Cork (IE)

(72) Inventors: Ronald S. Cok, Rochester, NY (US); Christopher Andrew Bower, Raleigh, NC (US); Matthew Meitl, Durham, NC (US); Brook Raymond, Cary, NC (US); Erich Radauscher, Raleigh, NC (US)

(73) Assignee: X Display Company Technology Limited, Dublin (IE)

( * ) Notice: Subject to any disclaimer, the term of this patent is extended or adjusted under 35 U.S.C. 154(b) by 68 days.

(21) Appl. No.: 15/908,297

(22) Filed: Feb. 28, 2018

(65) Prior Publication Data

US 2019/0265478 A1 Aug. 29, 2019

(51) Int. Cl.
*G02B 27/01* (2006.01)
*G06F 1/16* (2006.01)
*G06T 19/00* (2011.01)

(52) U.S. Cl.
CPC ....... *G02B 27/0172* (2013.01); *G06F 1/1601* (2013.01); *G06T 19/006* (2013.01); *G06F 2203/04804* (2013.01)

(58) Field of Classification Search
CPC . G02B 27/0172; G06T 19/006; G06F 1/1601; G06F 2203/04804
See application file for complete search history.

(56) References Cited

U.S. PATENT DOCUMENTS

| 3,709,589 A | 1/1973 | Lamb et al. |
| 5,550,066 A | 8/1996 | Tang et al. |
| 5,621,555 A | 4/1997 | Park |
| 6,084,579 A | 7/2000 | Hirano |

(Continued)

FOREIGN PATENT DOCUMENTS

| WO | WO-2010/132552 A1 | 11/2010 |
| WO | WO-2014/149864 A1 | 9/2014 |

(Continued)

OTHER PUBLICATIONS

Cok, R. S. et al., AMOLED displays with transfer-printed integrated circuits, Journal of SID, 19(4):335-341 (2011).

(Continued)

*Primary Examiner* — Mark W Regn
(74) *Attorney, Agent, or Firm* — William R. Haulbrook; Michael D. Schmitt; Choate, Hall & Stewart LLP

(57) ABSTRACT

A transparent display comprises an at least partially transparent display substrate having a display area and a bezel area adjacent to each of at least one corresponding side of the display area. Light-controlling elements are disposed in, on, or over the display substrate in the display area. Display wires are disposed in, on, or over the display substrate in the display area and are electrically connected to the light-controlling elements. Bezel wires are disposed in, on, or over the display substrate in the bezel area, the bezel wires electrically connected to respective ones of the display wires. The transparent display has a bezel transparency that varies over the bezel area. Bezel wires can be spaced apart by a bezel wire spacing that is greater than a width of the bezel wires. A display wire can be a mesh wire or have a depth greater than a width.

20 Claims, 8 Drawing Sheets

(56) References Cited

U.S. PATENT DOCUMENTS

| | | |
|---|---|---|
| 6,184,477 B1 | 2/2001 | Tanahashi |
| 6,403,985 B1 | 6/2002 | Fan et al. |
| 6,717,560 B2 | 4/2004 | Cok et al. |
| 6,756,576 B1 | 6/2004 | McElroy et al. |
| 6,825,559 B2 | 11/2004 | Mishra et al. |
| 7,417,648 B2 | 8/2008 | Credelle |
| 7,586,497 B2 | 9/2009 | Boroson et al. |
| 7,622,367 B1 | 11/2009 | Nuzzo et al. |
| 7,629,955 B2 | 12/2009 | Asao et al. |
| 7,687,812 B2 | 3/2010 | Louwsma et al. |
| 7,872,722 B2 | 1/2011 | Kimura |
| 7,932,123 B2 | 4/2011 | Rogers et al. |
| 7,943,491 B2 | 5/2011 | Nuzzo et al. |
| 7,982,296 B2 | 7/2011 | Nuzzo et al. |
| 7,999,454 B2 | 8/2011 | Winters et al. |
| 8,305,294 B2 | 11/2012 | Cok et al. |
| 8,506,867 B2 | 8/2013 | Menard |
| 8,558,243 B2 | 10/2013 | Bibl et al. |
| 8,619,011 B2 | 12/2013 | Kimura |
| 8,722,458 B2 | 5/2014 | Rogers et al. |
| 8,791,474 B1 | 7/2014 | Bibl et al. |
| 8,794,501 B2 | 8/2014 | Bibl et al. |
| 8,803,857 B2 | 8/2014 | Cok |
| 8,835,940 B2 | 9/2014 | Hu et al. |
| 8,865,489 B2 | 10/2014 | Rogers et al. |
| 8,884,844 B2 | 11/2014 | Yang et al. |
| 8,889,485 B2 | 11/2014 | Bower |
| 8,896,505 B2 | 11/2014 | Cok et al. |
| 8,934,259 B2 | 1/2015 | Bower et al. |
| 8,941,215 B2 | 1/2015 | Hu et al. |
| 8,987,765 B2 | 3/2015 | Bibl et al. |
| 9,105,714 B2 | 8/2015 | Hu et al. |
| 9,111,464 B2 | 8/2015 | Bibl et al. |
| 9,153,171 B2 | 10/2015 | Sakariya et al. |
| 9,161,448 B2 | 10/2015 | Menard et al. |
| 9,166,114 B2 | 10/2015 | Hu et al. |
| 9,217,541 B2 | 12/2015 | Bathurst et al. |
| 9,240,397 B2 | 1/2016 | Bibl et al. |
| 9,244,282 B2 | 1/2016 | Etienne et al. |
| 9,252,375 B2 | 2/2016 | Bibl et al. |
| 9,367,094 B2 | 6/2016 | Bibl et al. |
| 9,412,727 B2 | 8/2016 | Menard et al. |
| 9,437,782 B2 | 9/2016 | Bower et al. |
| 9,444,015 B2 | 9/2016 | Bower et al. |
| 9,478,583 B2 | 10/2016 | Hu et al. |
| 9,484,504 B2 | 11/2016 | Bibl et al. |
| 9,520,537 B2 | 12/2016 | Bower et al. |
| 9,555,644 B2 | 1/2017 | Rogers et al. |
| 9,583,533 B2 | 2/2017 | Hu et al. |
| 9,589,944 B2 | 3/2017 | Higginson et al. |
| 9,626,908 B2 | 4/2017 | Sakariya et al. |
| 9,698,308 B2 | 7/2017 | Bower et al. |
| 9,705,042 B2 | 7/2017 | Bower et al. |
| 9,765,934 B2 | 9/2017 | Rogers et al. |
| 9,860,955 B2 | 1/2018 | Kim et al. |
| 9,865,832 B2 | 1/2018 | Bibl et al. |
| 2002/0075440 A1 | 6/2002 | Deane |
| 2002/0096994 A1 | 7/2002 | Iwafuchi et al. |
| 2002/0175882 A1 | 11/2002 | Edwards et al. |
| 2003/0117369 A1 | 6/2003 | Spitzer et al. |
| 2005/0264472 A1 | 12/2005 | Rast |
| 2006/0063309 A1 | 3/2006 | Sugiyama et al. |
| 2007/0035340 A1 | 2/2007 | Kimura |
| 2007/0040770 A1 | 2/2007 | Kim |
| 2008/0012794 A1 | 1/2008 | Battersby |
| 2008/0018583 A1 | 1/2008 | Knapp et al. |
| 2008/0266214 A1 | 10/2008 | Naugler et al. |
| 2008/0303756 A1 | 12/2008 | Smith |
| 2009/0250690 A1 | 10/2009 | Shin et al. |
| 2010/0002180 A1* | 1/2010 | Kim .............. G02F 1/13452 349/143 |
| 2010/0123694 A1 | 5/2010 | Cok et al. |
| 2010/0186883 A1 | 7/2010 | Tomoda |
| 2010/0214247 A1 | 8/2010 | Tang et al. |
| 2011/0032277 A1 | 2/2011 | Lee et al. |
| 2011/0073864 A1 | 3/2011 | Liu et al. |
| 2011/0075342 A1* | 3/2011 | Gotham ............. H05K 5/02 361/679.21 |
| 2011/0242027 A1 | 10/2011 | Chang |
| 2012/0062135 A1 | 3/2012 | Tamaki et al. |
| 2012/0126233 A1 | 5/2012 | Chang et al. |
| 2012/0206428 A1 | 8/2012 | Cok |
| 2012/0206499 A1 | 8/2012 | Cok |
| 2012/0223875 A1 | 9/2012 | Lau et al. |
| 2013/0088416 A1 | 4/2013 | Smith et al. |
| 2013/0273695 A1 | 10/2013 | Menard et al. |
| 2014/0082934 A1 | 3/2014 | Cok |
| 2014/0085214 A1 | 3/2014 | Cok |
| 2014/0111442 A1 | 4/2014 | Cok et al. |
| 2014/0131715 A1 | 5/2014 | Liu et al. |
| 2014/0159043 A1 | 6/2014 | Sakariya et al. |
| 2014/0240617 A1 | 8/2014 | Fukutome et al. |
| 2014/0267683 A1 | 9/2014 | Bibl et al. |
| 2014/0319486 A1 | 10/2014 | Hong |
| 2015/0135525 A1 | 5/2015 | Bower |
| 2015/0296580 A1 | 10/2015 | Kim et al. |
| 2015/0359065 A1 | 12/2015 | Park et al. |
| 2015/0362165 A1 | 12/2015 | Chu et al. |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372052 A1 | 12/2015 | Bower et al. |
| 2015/0372053 A1 | 12/2015 | Bower et al. |
| 2015/0373793 A1 | 12/2015 | Bower et al. |
| 2016/0005721 A1 | 1/2016 | Bower et al. |
| 2016/0018094 A1 | 1/2016 | Bower et al. |
| 2016/0057822 A1 | 2/2016 | Chu |
| 2016/0057832 A1 | 2/2016 | Briggs et al. |
| 2016/0093600 A1 | 3/2016 | Bower et al. |
| 2016/0266697 A1 | 9/2016 | Cheng et al. |
| 2016/0290600 A1 | 10/2016 | Biederman et al. |
| 2016/0300900 A1 | 10/2016 | Miyake |
| 2016/0343771 A1 | 11/2016 | Bower et al. |
| 2016/0343772 A1 | 11/2016 | Bower et al. |
| 2017/0025075 A1 | 1/2017 | Cok et al. |
| 2017/0032735 A1 | 2/2017 | Lee et al. |
| 2017/0048976 A1* | 2/2017 | Prevatte ............. H01L 24/11 |
| 2017/0068362 A1 | 3/2017 | Den Boer et al. |
| 2017/0102797 A1 | 4/2017 | Cok |
| 2017/0167703 A1 | 6/2017 | Cok |
| 2017/0177105 A1 | 6/2017 | Wu et al. |
| 2017/0186740 A1 | 6/2017 | Cok et al. |
| 2017/0187976 A1 | 6/2017 | Cok |
| 2017/0206845 A1 | 7/2017 | Sakariya et al. |
| 2017/0256521 A1 | 9/2017 | Cok et al. |
| 2017/0256522 A1 | 9/2017 | Cok et al. |
| 2017/0287992 A1* | 10/2017 | Kwak ............... G06F 3/041 |
| 2017/0338374 A1 | 11/2017 | Zou et al. |
| 2017/0357127 A1 | 12/2017 | Cok et al. |
| 2018/0033853 A1 | 2/2018 | Bower et al. |
| 2018/0122298 A1 | 5/2018 | Lee et al. |
| 2018/0301472 A1 | 10/2018 | Matsukizono |
| 2019/0115407 A1 | 4/2019 | Cho et al. |
| 2019/0163304 A1 | 5/2019 | Shim et al. |
| 2019/0267363 A1 | 8/2019 | Bower et al. |

FOREIGN PATENT DOCUMENTS

| | | |
|---|---|---|
| WO | WO-2015/193434 A2 | 12/2015 |
| WO | WO-2016/030422 A1 | 3/2016 |
| WO | WO-2017/060487 A2 | 4/2017 |
| WO | WO-2017/149067 A1 | 9/2017 |

OTHER PUBLICATIONS

Cok, R. S. et al., Inorganic light-emitting diode displays using micro-transfer printing, Journal of the SID, 25(10):589-609, (2017).

Hamer et al., 63.2: AMOLED Displays Using Transfer-Printed Integrated Circuits, SID 09 Digest, 40(2):947-950 (2009).

Yoon, J. et al., Heterogeneously Integrated Optoelectronic Devices Enabled by MicroTransfer Printing, Adv. Optical Mater. 3:1313-1335 (2015).

(56) References Cited

OTHER PUBLICATIONS

Bower, C. A. et al., Micro-Transfer-Printing: Heterogeneous Integration of Microscale Semiconductor Devises using Elastomer Stamps, IEEE Conference, (2014).
Bower, C. A. et al., Transfer Printing: An Approach for Massively Parallel Assembly of Microscale Devices, IEEE, Electronic Components and Technology Conference, (2008).
Cok, R. S. et al., 60.3: AMOLED Displays Using Transfer-Printed Integrated Circuits, Society for Information Display, 10:902-904, (2010).
Feng, X. et al., Competing Fracture in Kinetically Controlled Transfer Printing, Langmuir, 23(25):12555-12560, (2007).
Gent, A.N., Adhesion and Strength of Viscoelastic Solids. Is There a Relationship between Adhesion and Bulk Properties?, American Chemical Society, Langmuir, 12(19):4492-4496, (1996).
Kim, Dae-Hyeong et al., Optimized Structural Designs for Stretchable Silicon Integrated Circuits, Small, 5(24):2841-2847, (2009).
Kim, Dae-Hyeong et al., Stretchable and Foldable Silicon Integrated Circuits, Science, 320:507-511, (2008).
Kim, S. et al., Microstructural elastomeric surfaces with reversible adhesion and examples of their use in deterministic assembly by transfer printing, PNAS, 107(40):17095-17100 (2010).
Kim, T. et al., Kinetically controlled, adhesiveless transfer printing using microstructured stamps, Applied Physics Letters, 94(11):113502-1-113502-3, (2009).
Meitl, M. A. et al., Transfer printing by kinetic control of adhesion to an elastomeric stamp, Nature Material, 5:33-38, (2006).
Michel, B. et al., Printing meets lithography: Soft approaches to high-resolution patterning, J. Res. & Dev. 45(5):697-708, (2001).
Trindade, A.J. et al., Precision transfer printing of ultra-thin AlInGaN micron-size light-emitting diodes, Crown, pp. 217-218, (2012).

\* cited by examiner

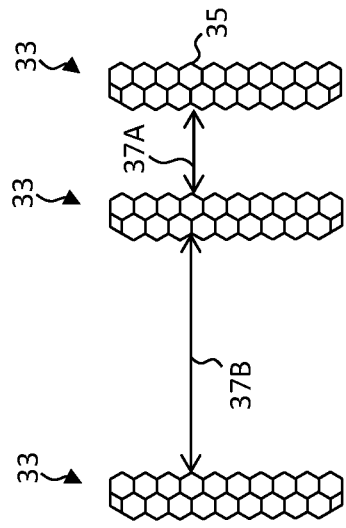
FIG. 6
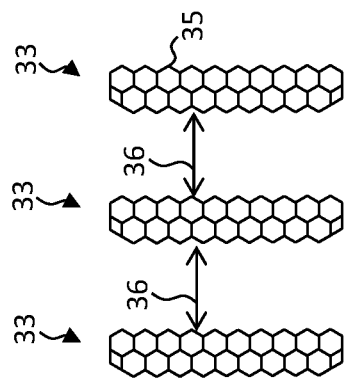
FIG. 7
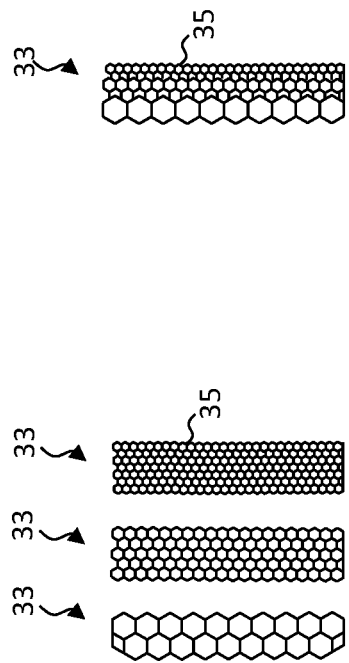
FIG. 9
FIG. 10
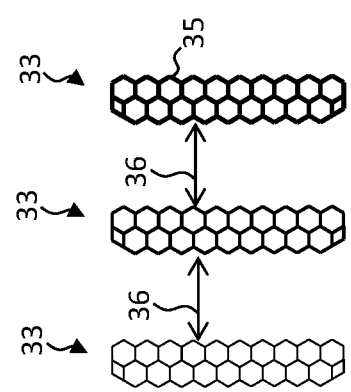
FIG. 8

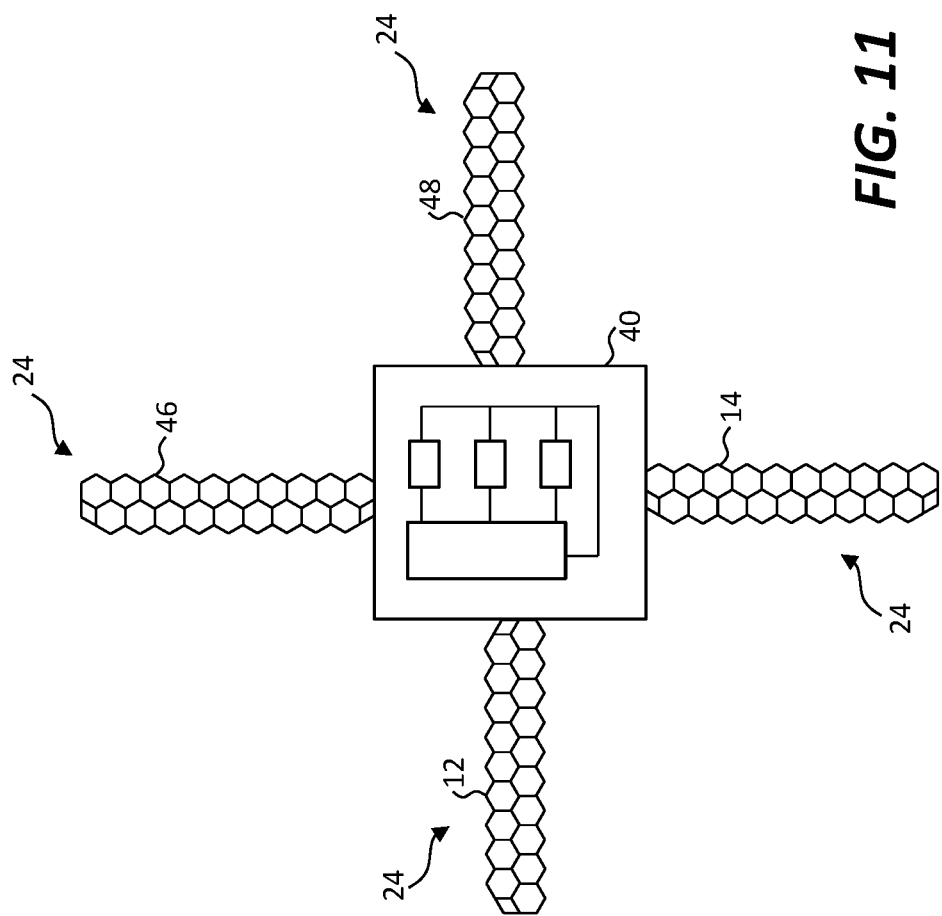

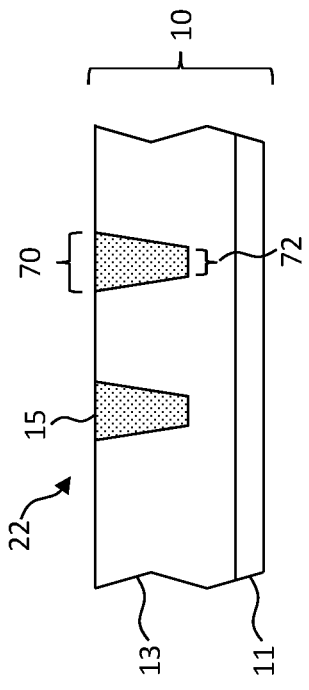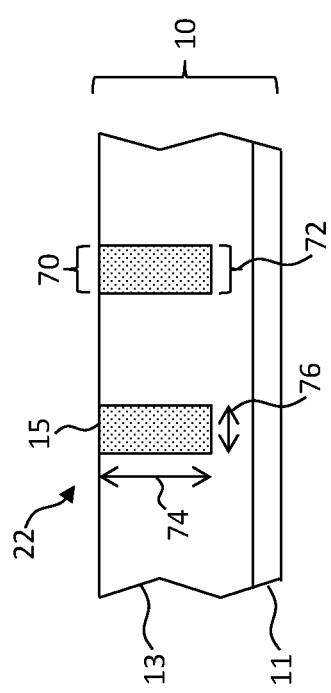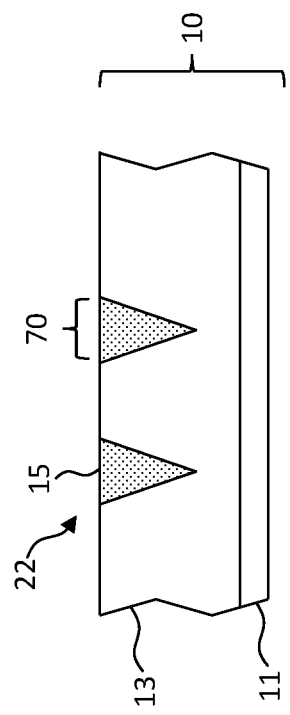

DISPLAYS WITH TRANSPARENT BEZELS

FIELD OF THE INVENTION

The present invention relates generally to transparent flat-panel displays and, in particular, to augmented-reality displays.

BACKGROUND OF THE INVENTION

Augmented-reality display systems overlay a computer-generated or electronically controlled image on an observer's view of the real world. Examples of such display systems include heads-up displays, often referred to as HUDs. Generally, a heads-up display is any transparent display that presents data without requiring users to look away from their usual viewpoints. HUDs are now used in military and commercial aircraft, automobiles, and other professional applications. Augmented-reality displays are also mounted into head-worn devices and referred to as head-mounted displays or helmet-mounted displays (HMDs). Such head-mounted augmented reality displays should be small and light-weight and should not obscure a user's view of the real world.

Most HUDs or HMDs use an optical projection system with a transparent screen in the user's field of view, for example as described in U.S. Pat. No. 3,709,589. Such an arrangement provides excellent transparency but can require complex optics and is relatively bulky. A more recent augmented-reality system discussed in U.S. Pat. No. 9,632,315 mounts an optical projection system into a pair of spectacles. However, in any augmented-reality display system, there is a need for visually integrating the augmented-reality display into the user's field of view as naturally and seamlessly as possible.

In some applications, the periphery of the HUD or HMD is clearly defined, for example when integrated into a pair of spectacles or a partially opaque helmet. In other applications, the display is integrated into a wider visual field in a viewing environment. There is a need, therefore, for transparent displays that are thin and transparent and are aesthetically and visually integrated into a user's field of view.

SUMMARY OF THE INVENTION

According to certain embodiments of the present invention, substantially transparent direct-view displays have an increased transparency in bezel areas adjacent to the display area of the transparent display. The increased transparency can be useful in augmented reality display systems, for example.

According to some embodiments of the present invention, a transparent display comprises a display substrate having a display area within which information can be displayed and a bezel area adjacent to each of at least one corresponding side of the display area. The display substrate is at least partially transparent. Light-controlling elements are disposed in, on, or over the display substrate in the display area. Display wires are disposed in, on, or over the display substrate in the display area and are electrically connected to the light-controlling elements. Bezel wires are disposed in, on, or over the display substrate in the bezel area and are electrically connected to respective ones of the display wires. The bezel wires are spaced apart by a bezel wire spacing that is greater than a width of the bezel wires. In some embodiments, the bezel wire spacing is at least twice the width of the bezel wires.

In some embodiments, the display wires obscure a display percentage of the display area and the bezel wires obscure a bezel percentage of the bezel area that is less than or equal to the display percentage. In some embodiments, the display wires and the light-controlling elements together obscure a display percentage of the display area and the bezel wires obscure a bezel percentage of the bezel area that is less than or equal to the display percentage. In some embodiments, the display substrate has a display transparency in the display area and a bezel transparency in the bezel area that is greater than or equal to the display transparency.

In some embodiments, the transparent display has a bezel transparency that varies over the bezel area. In some embodiments, a transparent display has a greater transparency in portions of the bezel area that are farther away from the display area and a lesser bezel transparency in portions of the bezel area that are closer to the display area. In some embodiments, bezel wires disposed farther from the display area are narrower than bezel wires disposed closer to the display area. In some embodiments, bezel wires disposed farther from the display area are spaced farther apart than bezel wires that are closer to the display area.

In some embodiments, one or more of the bezel wires are mesh wires comprising individual wires. In some embodiments, individual wires in a mesh wire disposed farther from a display area are narrower than individual wires in a mesh wire that is closer to the display area. In some embodiments, individual wires in a mesh wire disposed farther from the display area are spaced farther apart than individual wires in a mesh wire that is closer to the display area. In some embodiments, individual wires in a mesh wire have a variable spacing so that the mesh wires have a variable transparency. A variable-transparency mesh wire can be more transparent farther away from the display area.

In some embodiments, a display area is rectangular, a display substrate comprises four bezel areas, and each bezel area is adjacent to a respective side of the display area. In some embodiments, ones of the bezel wires disposed in, on, or over the display substrate are electrically connected to respective ones of the display wires in each of at least two or three of the four bezel areas. The ones of the bezel wires are electrically connected to the respective ones of the display wires and spaced apart by a bezel wire spacing that is greater than a width of the ones of the bezel wires. In some embodiments, dense bezel wires are electrically connected to respective ones of the display wires. The dense bezel wires can be disposed in, on, or over the display substrate in one of the four bezel areas. Dense bezel wires can have any one or more of (i) a width greater than a width of the display wires, (ii) a spacing less than a width of the bezel wires, or (iii) a bezel wire spacing that is less than a display wire spacing of the respective ones of the display wires.

In some embodiments, two or more of the light-controlling elements are disposed on a pixel substrate separate and independent from a display substrate, and the pixel substrate is disposed on the display substrate in the display area. In some embodiments, the pixel substrate is micro-transfer printed onto the display substrate in the display area, and the pixel substrate comprises a broken (e.g., fractured) or separated tether.

In some embodiments, the light-controlling elements comprise light-emitting elements. In some embodiments, the light-emitting elements are inorganic light-emitting diodes. In some embodiments, the inorganic light-emitting diodes are micro-transfer printed light-emitting diodes each comprising a broken (e.g., fractured) or separated tether. In some embodiments, each inorganic light-emitting diode has at least one or more of a width from 2 to no more than 5 µm, 5 to no more than 10 µm, 10 to no more than 20 µm, or 20 to no more than 50 µm, a length from 2 to no more than 5 µm, 5 to no more than 10 µm, 10 to no more than 20 µm, or 20 to no more than 50 µm, and a thickness from 2 to no more than 5 µm, 5 to no more than 10 µm, 10 to no more than 20 µm, or 20 to no more than 50 µm.

In some embodiments of the present invention, a transparent display comprises a display substrate having a display area within which information can be displayed and a bezel area adjacent to each of at least one corresponding side of the display area, wherein the display substrate is at least partially transparent, light-controlling elements are disposed in, on, or over the display substrate in the display area, display wires are disposed in, on, or over the display substrate in the display area, the display wires are electrically connected to the light-controlling elements, and bezel wires are disposed in, on, or over the display substrate in the bezel area. The bezel wires are each electrically connected to a respective one or more of the display wires. The display wires obscure a display percentage of the display area and the bezel wires obscure a bezel percentage of the bezel area that is less than or equal to the display percentage.

In some embodiments, the display wires and the light-controlling elements together obscure a display percentage of the display area and the bezel wires obscure a bezel percentage of the bezel area that is less than or equal to the display percentage.

In some embodiments of the present invention, a transparent display comprises a display substrate having a display area within which information can be displayed and a bezel area adjacent to each of at least one corresponding side of the display area, wherein the display substrate is at least partially transparent, light-controlling elements are disposed in, on, or over the display substrate in the display area, display wires are disposed in, on, or over the display substrate in the display area, the display wires electrically connected to the light-controlling elements, and bezel wires are disposed in, on, or over the display substrate in the bezel area. The bezel wires are electrically connected to respective ones of the display wires. The display substrate has a display transparency in the display area and a bezel transparency in the bezel area that is greater than or equal to the display transparency.

In some embodiments of the present invention, a transparent display comprises a display substrate having a display area within which information can be displayed, the display substrate is at least partially transparent, light-controlling elements are disposed in, on, or over the display substrate in the display area, the light-controlling elements are spaced apart in, on, or over the display substrate in a regular two-dimensional array, display wires are disposed in, on, or over the display substrate in the display area, the display wires are electrically connected to the light-controlling elements, and the display wires are spaced apart in, on, or over the display substrate in a regular array. One or more of the display wires is a mesh wire comprising individual wires. In some embodiments, the mesh wire(s) cover 25%, 50%, 75%, or 90% or more of the display area between the light-controlling elements.

In some embodiments, one or more of the display wires is a row wire extending in a row direction across the display area or one or more of the display wires is a column wire extending in a column direction different from the row direction across the display area. At least one of the row wires can be a mesh wire, at least one of the column wires can be a mesh wire, or at least one of the row wires and one of the column wires are mesh wires. In some embodiments, one or more of the display wires is a row wire extending in a row direction across the display area and one or more of the display wires is a column wire extending in a column direction different from the row direction across the display area and only the row wire(s) or only the column wire(s) are mesh wires. In some embodiments, both row wire(s) and column wire(s) are mesh wires.

In some embodiments of the present invention, a transparent display comprises a display substrate having a display area within which information can be displayed, the display substrate is at least partially transparent, light-controlling elements are disposed in, on, or over the display substrate in the display area, the light-controlling elements are spaced apart in, on, or over the display substrate in a regular two-dimensional array, display wires are disposed in, on, or over the display substrate in the display area, the display wires are electrically connected to the light-controlling elements, and the display wires are spaced apart in, on, or over the display substrate in a regular array, wherein, for each of the display wires, the depth of a display wire can be greater than the width of the display wire. In some embodiments, a depth to width aspect ratio of the display wire is at least 1.5, at least 3, or at least 5.

In some embodiments, the display wire has a bottom surface area that is smaller than an opposing top surface area. In some embodiments, the display wire has a rectangular, triangular, or trapezoidal cross section.

In some embodiments, the transparent display is a matrix-addressed display comprising inorganic light-emitting micro-diodes (micro-LEDs) and having row-select and column-data lines (display wires). Each micro-LED is controlled by a row-select line in combination with a column-data line. The control can be passive-matrix control. In other embodiments, the transparent display is an active-matrix display and a controller, for example a pixel controller, is disposed in, on, or over the display substrate in the display area in association with one or more micro-LEDs and electrically connected to the one or more micro-LEDs to control the one or more micro-LEDs using select and data signals provided by the row-select line and column-data lines, respectively.

In certain embodiments, light emitters are organized into pixels and a plurality of pixels forms a regular array on the display substrate in the display area or are irregularly or randomly arranged. The light emitters can be inorganic light-emitting diodes (inorganic LEDs) or micro-inorganic-light-emitting diodes (micro-LEDs). Each pixel can comprise one or more micro-LEDs. In certain embodiments, each pixel includes a single light emitter. In certain embodiments, each pixel includes at least three light emitters, each of the at least three light emitters emitting light of a different color.

In some embodiments, the one or more light emitters are disposed on a display substrate. In other embodiments, the one or more light emitters are disposed on a pixel substrate separate and independent from the display substrate and each pixel substrate is disposed on or over the display substrate. A single micro-LED, or multiple micro-LEDs can be disposed on each pixel substrate. In other embodiments, multiple pixels share a common pixel substrate. In certain embodiments, each pixel includes a pixel controller and the pixel controller is electrically connected to the one or more light emitters in the pixel to control the light output by the one or more light emitters. In some embodiments, the pixel controller is located on the display substrate. In other embodiments, a pixel includes a pixel substrate separate from the display substrate and the pixel controller is located on the pixel substrate. Each pixel substrate can comprise a broken or separated tether as a consequence of micro-transfer printing the pixel substrate. In other configurations, each micro-LED of the plurality of micro-LEDs has a broken or separated tether as a consequence of micro-transfer printing the micro-LEDs. Pixel controllers can be micro-transfer printed and have a broken or separated tether as a consequence of micro-transfer printing the controller.

In certain embodiments, one or more electrical conductors such as display wires electrically connect two or more of the pixels in the display area. In certain embodiments, the one or more display wires conduct signals for controlling the pixels, for conducting power to the pixels, or for providing a ground reference voltage.

In certain embodiments, the display substrate is at least one of plastic, glass, and sapphire. In certain embodiments, the display substrate is transparent to visible light. In certain embodiments, the display substrate is at least partially transparent to visible light. In certain embodiments, the transparent display has no less than 30 percent transparency to visible light (e.g., no less than 30%, 50%, 70%, 80%, 90%, or 95% transparency to visible light).

Certain embodiments of the present invention provide a transparent display with reduced ambient light occlusion and increased transparency in bezel areas adjacent to a display area of the transparent display. The increased transparency provides improved visibility of the real world in an observer's field of view.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 6-10 are schematic illustrations of mesh wires according to exemplary embodiments of the present invention;

FIG. 11 is a schematic plan view illustrating a pixel with mesh wires in a display area of a transparent display, according to exemplary embodiments of the present invention;

FIG. 14 is a cross section illustrating a high-aspect-ratio cured wire having a rectangular cross section, according to exemplary embodiments of the present invention;

FIG. 15 is a cross section illustrating a high-aspect ratio cured wire having a trapezoidal cross section, according to exemplary embodiments of the present invention; and FIG. 16 is a cross section illustrating a high-aspect-ratio cured wire having a triangular cross section, according to exemplary embodiments of the present invention.

Figure 1:
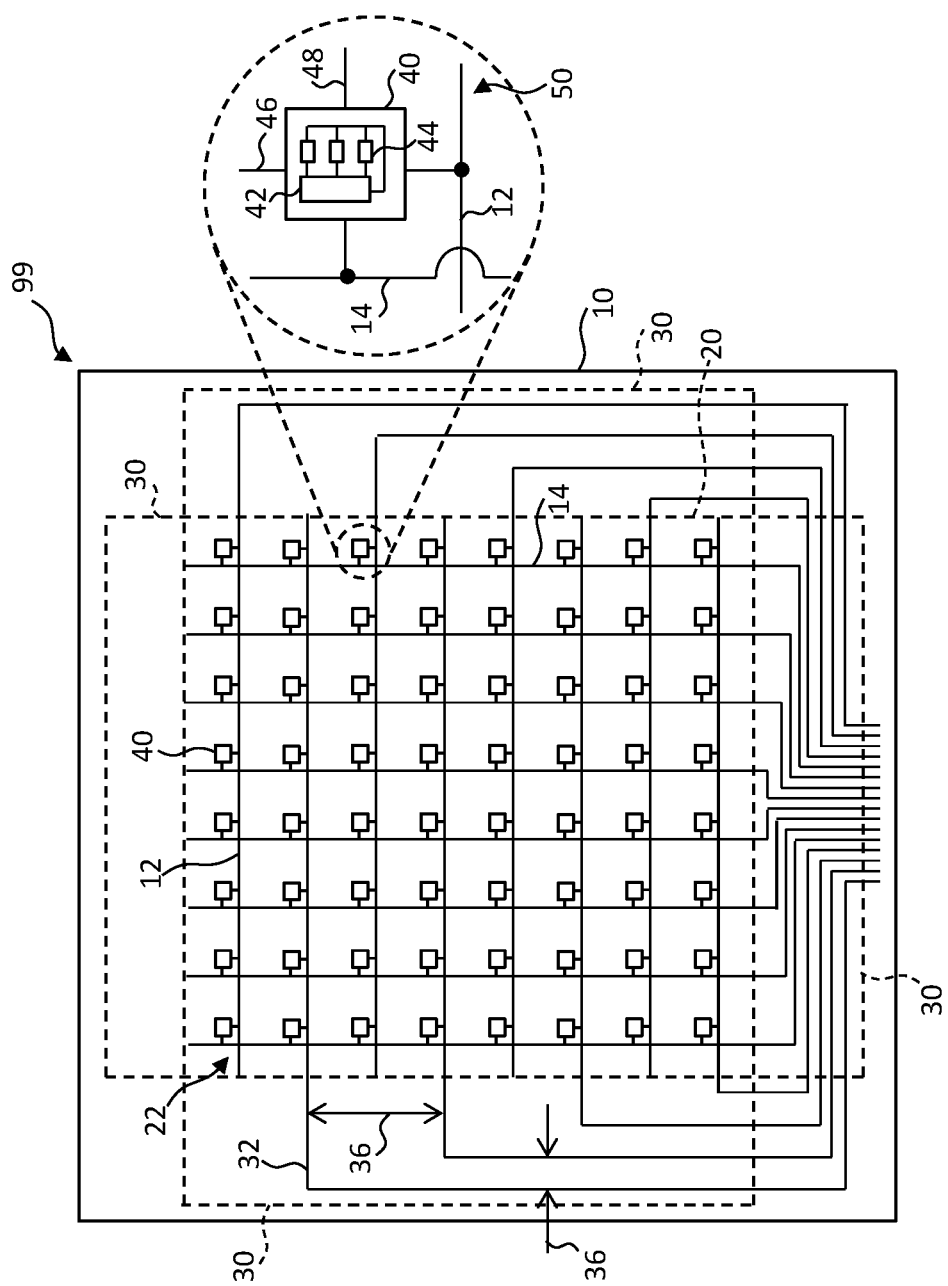
FIG. 1 is a schematic plan view illustrating an exemplary transparent display, according to illustrative embodiments of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

Certain embodiments of the present invention comprise transparent displays, for example direct-view transparent displays in which light-controlling elements in the transparent display are in a viewer's line of sight. Transparent displays can be used in augmented-reality (AR) systems in which an artificially generated image is overlaid on a user's view of the world. For example, head's-up displays (HUDs) present imagery such as data or graphical elements in a transparent display through which a user views the world.

In conventional designs, AR systems rely on optical projection to provide information on a highly transparent viewing surface through which the viewer looks. However, and according to some embodiments of the present invention, transparent displays can be direct-view displays that incorporate an array of micro-light-emitting diodes (micro-LEDs). The micro-LEDs are controlled by a display controller to present an image on the transparent display in the user's view and, because the micro-LEDs are so small (for example, having at least one of a length no more than 50 µm, 25 µm, 15 µm, 10 µm, 7 µm, 5 µm, or 3 µm and a width no more than 50 µm, 25 µm, 15 µm, 10 µm, 7 µm, 5 µm, or 3 µm), they occupy relatively little of the display viewing area so that the display appears to be substantially transparent, for example at least 50%, at least 70%, at least 80%, at least 85%, at least 90%, at least 95% or more transparent to visible light (e.g., light between 350 and 750 nm in wavelength) in an "off" state (i.e., when not directing light toward a viewer).

Figure 3:
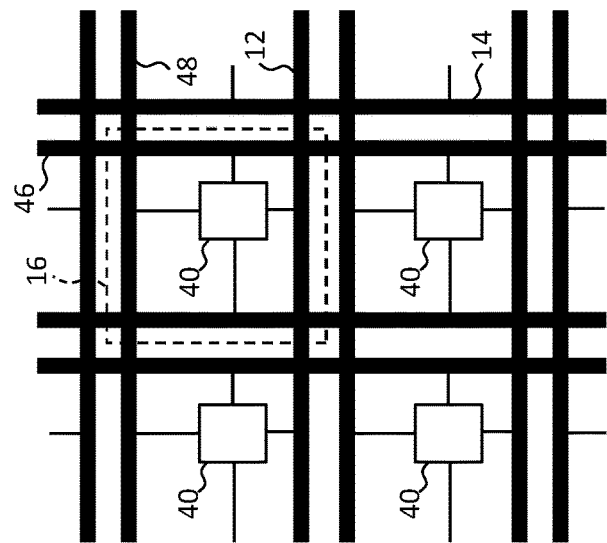
FIG. 3 is a schematic plan view corresponding to a detail of FIG. 1 illustrating a display unit area in exemplary embodiments of the present invention.
Figure 2:
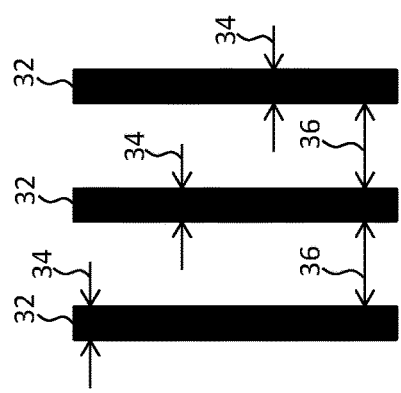
FIG. 2 is a schematic plan view of bezel wires, according to illustrative embodiments of the present invention.

Referring to FIG. 1, the detail inset of FIG. 1, and the detail illustrations of FIGS. 2 and 3, a transparent display 99 according to illustrative embodiments of the present invention comprises a display substrate 10 having a display area 20 for displaying information and a bezel area 30 adjacent to each of at least one (or more) corresponding sides of the display area 20. A display substrate 10 is substantially or at least partially transparent, for example having a transparency that is at least 50%, at least 70%, at least 80%, at least 85%, at least 90%, at least 95% or more transparent to visible light. In certain embodiments of the present invention, a display substrate 10 is a glass or polymer substrate, for example as found in the display industry.

Figure 12:
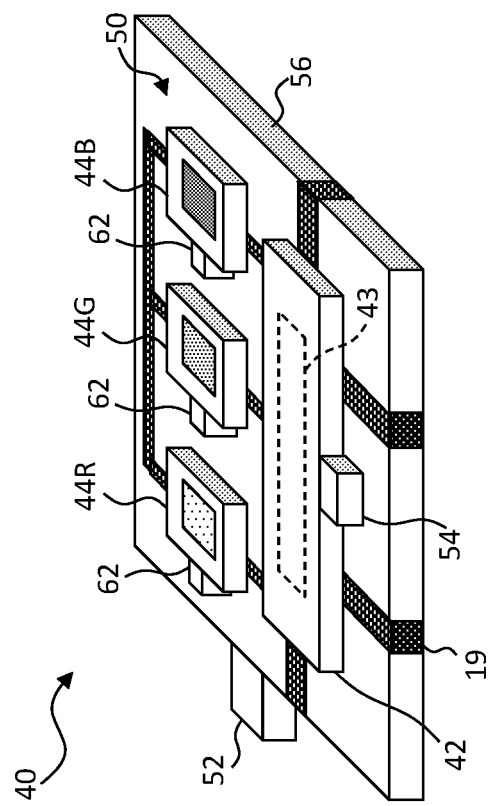
FIG. 12 is a perspective illustrating a pixel module, according to exemplary embodiments of the present invention.

Light-controlling elements 40 are disposed in, on, or over a display substrate 10 in a display area 20. Light-controlling elements 40 can control light by controllably absorbing light, transmitting light, reflecting light, or emitting light. As shown in the FIG. 1 inset, in some embodiments of the present invention, light-controlling elements 40 comprise light-emitting diodes (LEDs) such as micro-LEDs 44 arranged in pixels 50 in an active-matrix configuration under the control of a micro-controller 42 disposed in, on, or over a display substrate 10 in a display area 20. LEDs may be inorganic light-emitting diodes. In some embodiments of the present invention, light-controlling elements 40 are arranged in a passive-matrix configuration under the control of an external display controller (not shown in FIG. 1) and do not require a local pixel controller 42. Light-controlling elements 40 can comprise a single light controller, for example a light emitter such as a micro-LED 44 in a pixel 50. In some embodiments, a pixel 50 of a transparent display 99 includes multiple light-controlling elements 40 such as micro-LEDs 44, for example red, green, and blue micro-LEDs 44R, 44G, 44B as shown in FIG. 12 and discussed below. Micro-light-emitting diodes 44 can comprise compound semiconductors processed using photolithography. Micro-controllers 42 (or display controllers) can be integrated circuits, such as CMOS digital integrated circuits comprising silicon semiconductor materials processed using photolithography.

Display wires 22 are disposed in, on, or over a display substrate 10 in a display area 20 and are electrically connected to light-controlling elements 40. For example, display wires 22 can comprise any one or more of power wires 46, ground wires 48, row wires 12, and column wires 14. Row wires 12 and column wires 14 can be signal wires or, in some embodiments, data wires.

Bezel wires 32 are disposed in, on, or over a display substrate 10 in one or more bezel areas 30. Bezel wires 32 are electrically connected to respective display wires 22 and are spaced apart over a display substrate 10 by a bezel wire spacing 36 that is greater than a bezel wire width 34 of the bezel wires 32 over the display substrate 10. Bezel wire spacing 36 can be in any direction between bezel wires 32 (e.g., adjacent bezel wires 32) on a surface of a display substrate 10 in a bezel area 30, for example horizontally, vertically, or diagonally, in any desired display substrate 10 orientation. Bezel wires 32 can be spaced apart over a display substrate 10 by a bezel wire spacing 36 that is greater than a bezel wire width 34 of the bezel wires 32 over the display substrate 10 in any one direction, in multiple directions, or in all directions. In some embodiments, any two bezel wires 32 in a bezel area 30 are spaced apart by more than a width of any of the bezel wires 32.

Display wires 22 or bezel wires 32 can comprise metal or metal alloys or transparent metal oxides (for example deposited on the display substrate 10 by evaporation or sputtering and patterned using photolithographic methods), or cured, conductive inks, for example comprising metallic nanoparticles (e.g., in a cured matrix) deposited using coating and, optionally, cured with heat or electromagnetic radiation. Display wires 22 (and bezel wires 32) can be disposed on multiple (e.g., different) substrate layers of a display substrate 10 so that they do not electrically short on a surface of the display substrate 10. Vias can be provided to make electrical connections between devices or structures disposed on a display substrate 10 surface and display or bezel wires 22, 32 in a display substrate layer below the display substrate 10 surface.

In typical photolithographic processing, a resolution of the processed structure is defined by the smallest feature that can be formed on the display substrate 10. The smallest feature can be a gap, spacing, or separation between two elements (for example between two adjacent bezel wires 32) or the smallest size of an element, for example a width of a display wire 22 or bezel wire 32. Because, according to certain embodiments of the present invention, bezel wires 32 are spaced apart over a display substrate 10 by a bezel wire spacing 36 that is greater than a bezel wire width 34 of the bezel wires 32 over the display substrate 10, the bezel wires 32 are not spaced as closely as they could be spaced by the photolithographic process used to define the bezel wires 32. Thus, bezel areas 30 can be more transparent than a bezel area 30 that comprises bezel wires 32 disposed and structured at a maximum density.

In typical displays of the prior art, the bezel area is made as small as possible to reduce the area around the display viewing area by disposing the bezel wires in as dense a configuration as possible over the display substrate. This dense configuration reduces costs for and area of the display and gives an attractive appearance. However, by disposing the bezel wires as densely as possible over the display substrate, the transparency of the transparent display around the display area is greatly reduced. For applications in which display transparency or bezel area transparency is of no interest, this is acceptable, even preferable. Thus, transparent direct-view displays of the prior art have distinctly visible substantially opaque edges (bezel areas). Such opaque display edges can be problematic for AR applications. Consequently, as noted above, most AR displays use optical projection to avoid visible opaque display edges, or simply accept opaque edges of a display in an observer's field of view. Optical projection, however, requires complex optics, a display surface, and additional volume that can be a problem, especially for AR displays that are worn on the head, such as helmet-mounted displays. Displays with opaque edges are distracting and interfere with and inhibit an observer's field of view. In contrast, certain embodiments of the present invention provide a substantially transparent direct-view display 99 with reduced volume, and without requiring optical projection, whose bezel areas 30 have increased transparency, are not substantially opaque, and are therefore more acceptable in an observer's field of view.

In some embodiments of the present invention, a bezel wire spacing 36 is at least twice the width of bezel wires 32, for example as shown in FIG. 2. In some embodiments of the present invention, bezel wire spacing 36 is at least three times, at least four times, at least five times, at least seven times, at least ten times, at least twenty times, at least fifty times, at least seventy-five times, at least one hundred times, or more than one hundred times the width of the bezel wires 32. Without wishing to be bound to any particular theory, an increased spacing between the bezel wires 32 increases the display area 30 transparency.

In some embodiments of the present invention, display wires 22 obscure a display percentage of the display area 20 and bezel wires 32 obscure a bezel percentage of the bezel area 30 that is less than or equal to the display percentage. Thus, a bezel area 30 can be more transparent than a display area 20 of a transparent display 99. Even if portions of a display area 20 that are occupied by light-controlling elements 40 (e.g., micro-LEDs 44, micro-controller 42) that obscure display area 20 portions are taken into account, a bezel area 30 can be more transparent than a display area 20. Thus, in some embodiments of the present invention, display wires 22 and light-controlling elements 40 together obscure a display percentage of a display area 20 and bezel wires 32 obscure a bezel percentage of a bezel area 30 that is less than or equal to the display percentage. In some such embodiments, a display area 20 has a display transparency and a bezel area 30 has a bezel transparency that is greater than or equal to the display transparency.

A display area 20 transparency is calculated as the percentage of the entire display area 20 that is not obscured, for example by display wires 22 and light-controlling elements 40, when the display is in an "off" state (i.e., when not directing light toward a viewer). As shown in FIG. 3, a display area 20 transparency can be calculated by determining the percentage of a display unit area 16 that tiles an entire display area 20 that is not obscured (i.e., where the display unit area 16 acts a unit cell in a lattice), for example by display wires 22 and light-controlling elements 40.

Figure 4:
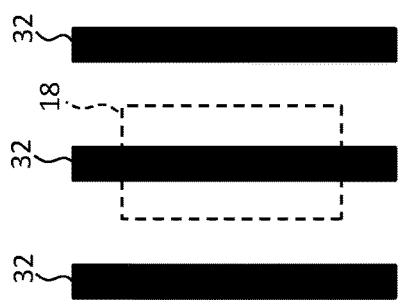
FIG. 4 is a schematic plan view of bezel wires illustrating a bezel unit area in exemplary embodiments of the present invention.

Similarly, bezel area 30 transparency is calculated as the percentage of the entire bezel area 30 that is not obscured, for example by bezel wires 32. As shown in FIG. 4, a bezel area 30 transparency can be calculated by determining the percentage of a bezel unit area 18 that tiles an entire bezel area 30 that is not obscured (i.e., where the bezel unit area 18 acts a unit cell in a lattice), for example by bezel wires 32. However, bezel wires 32 in a bezel area 30 are often not laid out in as regular a fashion as display wires 22 and light-controlling elements 40 in a display area 20 and it can be more difficult to determine a bezel unit area 18 that tiles a bezel area 30. In such cases, different bezel unit areas 18 that tile portions of a bezel area 30 can be determined and their average transparency (weighted by frequency of occurrence and size) used to calculate a bezel area 30 transparency.

Therefore, according to some embodiments of the present invention, a transparent display 99 comprises a display substrate 10 having a display area 20 within which information can be displayed and a bezel area 30 adjacent to each of at least one corresponding side of the display area 20. A display substrate 10 is at least partially transparent. Light-controlling elements 40 are disposed in, on, or over the display substrate 10 in a display area 20. Display wires 22 are disposed in, on, or over a display substrate 10 in a display area 20. Display wires 22 are electrically connected to light-controlling elements 40. Bezel wires 32 are disposed in, on, or over a display substrate 10 in a bezel area 30. Bezel wires 32 are each electrically connected to a respective one or more of the display wires 22. Display wires 22 obscure a display percentage of a display area 20 and bezel wires 32 obscure a bezel percentage of a bezel area 30 that is less than or equal to the display percentage. In some embodiments, display wires 22 and light-controlling elements 40 together obscure a display percentage of a display area 20 and bezel wires 32 obscure a bezel percentage of a bezel area 30 that is less than or equal to the display percentage.

Similarly, in some embodiments of the present invention, a transparent display 99 comprises a display substrate 10 having a display area 20 within which information can be displayed and a bezel area 30 adjacent to each of at least one corresponding side of the display area 20. A display substrate 10 is at least partially transparent. Light-controlling elements 40 are disposed in, on, or over a display substrate 10 in a display area 20. Display wires 22 are disposed in, on, or over a display substrate 10 in a display area 20. Display wires 22 are electrically connected to light-controlling elements 40. Bezel wires 32 are disposed in, on, or over a display substrate 10 in a bezel area 30. Bezel wires 32 are electrically connected to respective ones of the display wires 22. A display substrate 10 has a display transparency in a display area 20 and a bezel transparency in a bezel area 30 that is greater than or equal to the display transparency.

Figure 5:
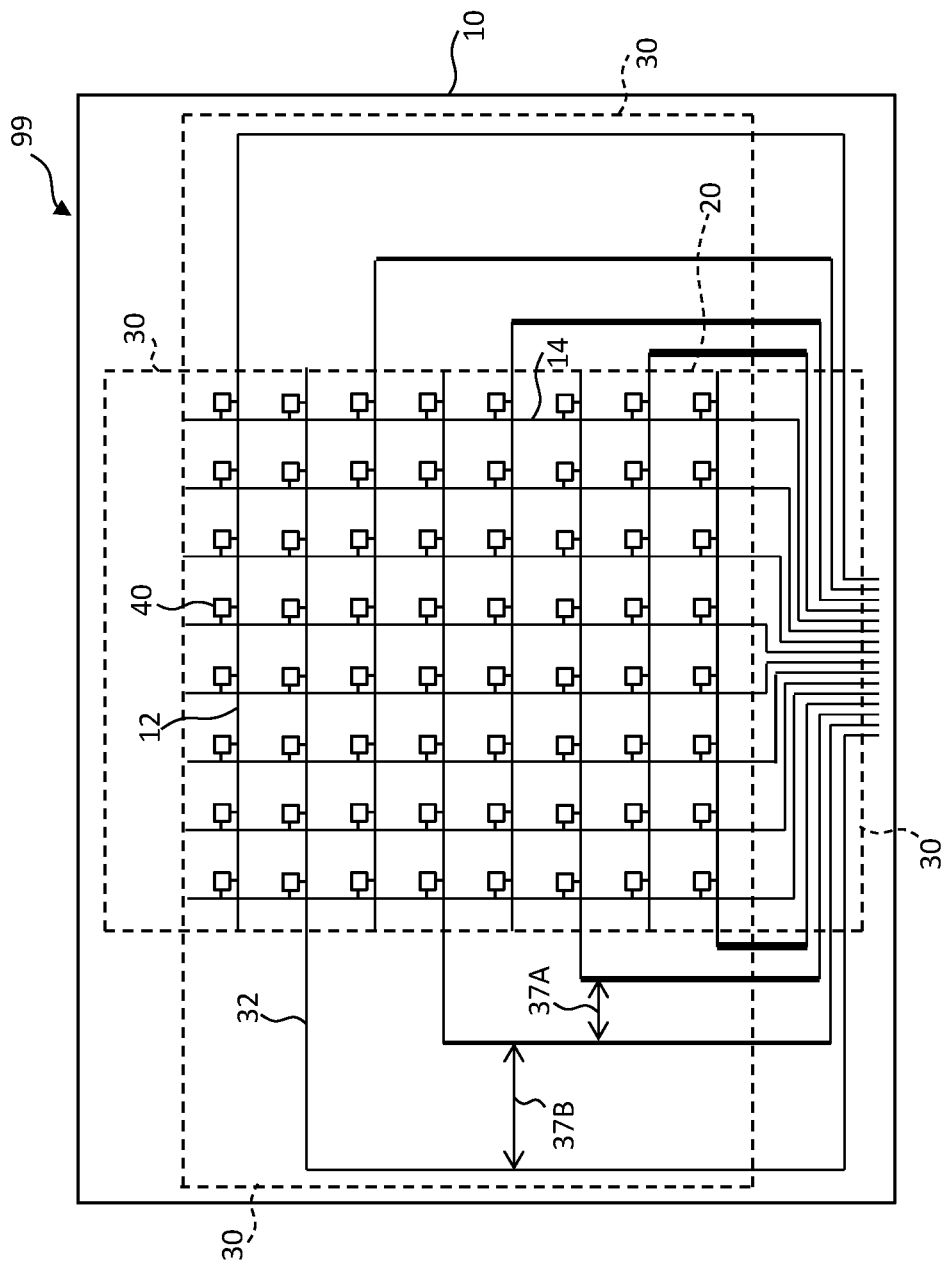
FIG. 5 is a schematic plan view of a transparent display illustrating variable bezel transparency, according to exemplary embodiments of the present invention.

In some embodiments of the present invention and with reference to FIG. 5, a transparent display 99 has a bezel transparency that varies over a bezel area 30. FIG. 5 differs from FIG. 1 in that bezel areas 30 on either side of the display area 20 are larger and include bezel wires 32 that are spaced apart by variable amounts. As shown, bezel wires 32 disposed farther from a display area 20 are spaced farther apart than bezel wires 32 that are closer to the display area 20. In particular, two bezel wires 32 are spaced apart by a bezel wire spacing 37A that is smaller than a bezel wire spacing 37B between two bezel wires 32 that are farther from the display area 20 than the bezel wires 32 spaced apart by bezel wire spacing 37A. Thus, the transparency of portions of a bezel area 30 farther from the display area 20 is greater than the transparency of portions of a bezel area 30 closer to the display area 20. Such a variable transparency allows a substantially transparent display 99 to more gradually become less transparent from a bezel area 30 of the transparent display 99 to the display area 20 and then to gradually become more transparent again in a bezel area 30 on an opposite side of the display area 20. Such a more gradual transition from a completely transparent area in an observer's view outside the area of the transparent display 99 to a less transparent display area 20 of the transparent display 99 can be more acceptable to a viewer (e.g., more aesthetically pleasing and/or less distracting to the viewer). Although a transparent display 99 is referred to as transparent, it is substantially transparent (e.g., greater than or equal to 50%, 70%, 80%, 85%, or 90% transparent) and is not completely (100%) transparent and can be observably less transparent than an area of an observer's view that does not include a transparent display 99. It is an object of certain embodiments of the invention to mitigate the observable change in transparency between a display area 20 of a transparent display 99 in an observer's field of view and non-display locations in the observer's field of view that do not include the transparent display 99 by making the change in transparency from the non-display locations to the display area 20 more gradual (and vice versa).

In certain embodiments of the present invention, a display area 20 is rectangular and a display substrate 10 comprises four bezel areas 30. Each bezel area 30 is adjacent to a respective side of the display area 20. For convenience, these can be labeled top, bottom, left, and right, where top and bottom are on opposite sides of the display area 20 and left and right are on other opposite sides of the display area 20. The bottom bezel area 30 can be (arbitrarily) taken as the bottom of the Figures (e.g., FIG. 1 and FIG. 5) and have an increased density of wires. Ones of the bezel wires 32 disposed in, on, or over the display substrate 10 are electrically connected to respective ones of the display wires 22 in each of two or three of the four bezel areas 30. Ones of the bezel wires 32 are spaced apart by a bezel wire spacing 36 that is greater than a bezel wire width 34 of the ones of the bezel wires 32. Dense bezel wires 32 can be electrically connected to respective ones of the display wires 22 and are disposed in, on, or over the display substrate 10 in one of the four bezel areas 30, e.g., in the bottom bezel area 30. Dense bezel wires 32 can have any one or more of (i) a width greater than or equal to a width of the display wires 22, (ii) a bezel wire spacing 36 less than a bezel wire width 34 of the bezel wires 32, or (iii) a bezel wire spacing 36 that is less than a display wire 22 spacing of the respective ones of the display wires 22.

Although not shown in FIG. 5, bezel wires 32 can be included in a bezel area 30 above and on a top side of the display area 20. Bezel wires 32 can be electrically connected to display wires 22 or electrically separate dummy wires provided (e.g., next to or between bezel wires 32) simply to obscure light and match the transparency of the display area 20 or other bezel areas 30, e.g., the left and right bezel areas 30, or provide a spatially gradual transition in transparency on the top side of the display area 20. Electrically separate dummy wires can be provided in any bezel area 30 of a transparent display 99. The bottom bezel area 30 is used as a connector, is densely packed with bezel wires 32 and, in accordance with FIG. 5, may not be substantially transparent. In some embodiments, bezel wires 32 in the bottom bezel area 30 are spaced apart to provide increased transparency in that area.

In conventional displays of the prior art, bezel wires are frequently thicker or wider than display wires, to reduce wire resistance, especially for wires that carry high-current power or ground signals and are spaced closely together to reduce the bezel area in a substantially opaque configuration in bezel areas. In contrast, certain embodiments of the present invention provide increased transparency in bezel areas 30. This increased contrast can be provided in a variety of ways. In some embodiments, as shown in FIG. 1, bezel wires 32 are spaced apart by a bezel wire spacing 36 that is greater than a width of the bezel wires 32. In some embodiments, bezel wires 32 have a reduced bezel wire width 34. Bezel wires 32 disposed farther from the display area 20 can be spaced apart farther or can be narrower than bezel wires 32 disposed closer to a display area 20, as shown in FIG. 5. A combination of bezel wire width 34 and bezel wire spacing 36 can be used to control a bezel area 30 transparency and can provide variable transparency in a bezel area 30.

As shown in FIG. 6, in certain embodiments, one or more bezel wires 32 are mesh bezel wires 33. Mesh bezel wires 33 are spaced-apart, electrically connected individual wires 35 in a common electrical conductor, for example a power, ground, or signal conductor. Each individual wire 35 typically has a reduced width compared to the width of a non-mesh electrical conductor or wire and appears at least somewhat transparent because the mesh covers only a portion of the area occupied by the individual wires 35 of the mesh bezel wire 33. Mesh bezel wires 33 can have a regular or irregular structure. As shown in FIG. 7, mesh bezel wires 33 can be spaced apart by different, variable bezel wire spacing 37A, 37B to provide variable transparency in a bezel area 30, for example corresponding to FIG. 5.

As shown in FIGS. 6 and 7, in some embodiments, individual wires 35 in mesh bezel wires 33 all have the same width or thickness. In some embodiments, as shown in FIG. 8, the width or thickness of individual wires 35 in different mesh bezel wires 33 is different, so that mesh bezel wires 33 can have different transparencies and can be used to vary the transparency of the bezel area 30 in which the different mesh bezel wires 33 are disposed. In FIG. 8, individual wires 35 of mesh bezel wires 33 disposed farther from the display area 20 can be narrower than individual wires 35 of mesh bezel wires 33 that are closer to the display area 20.

Referring to FIG. 9, the density of the individual wires 35 (wires per unit area) in different mesh bezel wires 33 is different, so that different mesh bezel wires 33 can have different transparencies and can be used to vary the transparency of a bezel area 30 in which different mesh bezel wires 33 are provided. Individual wires 35 in mesh bezel wires 33 disposed farther from a display area 20 can be spaced farther apart than individual wires 35 in mesh bezel wires 33 that are closer to the display area 20.

Referring to FIG. 10, the density of the individual wires 35 (wires per unit area) in a single variable-mesh bezel wire 33 varies within the single variable-mesh bezel wire 33 to provide a mesh bezel wire 33 with variable transparency and can be used to vary the transparency of a bezel area 30 in which the single variable-mesh bezel wire 33 is provided.

In some embodiments of the present invention, display wires 22 can be display mesh wires 24 rather than, or in addition to, mesh bezel wires 33. Referring to FIG. 1 in combination with FIG. 11, in some embodiments, a transparent display 99 comprises a display substrate 10 having a display area 20 within which information can be displayed. The display substrate 10 is at least partially transparent, for example having a transparency greater than or equal to 50%, 70%, or 90% transparent to visible light. Light-controlling elements 40 are disposed in, on, or over the display substrate 10 in the display area 20. The light-controlling elements 40 are spaced apart in, on, or over the display substrate 10 in a regular two-dimensional array. Display wires 22 are disposed in, on, or over the display substrate 10 in the display area 20, are electrically connected to the light-controlling elements 40, and are spaced apart in, on, or over the display substrate 10 in a regular array. One or more of the display wires 22 is a display mesh wire 24, as shown in FIG. 11. By providing display mesh wires 24 in a display area 20, the transparency of the display area 20 is made more uniform and more visually appealing to observers, especially for augmented reality (AR) displays. Display mesh wires 24 or display wires 22 can electrically connect to a light-controlling element 40 disposed on a substrate (e.g., a pixel substrate 56) underneath or on top of the substrate (e.g., by wrapping up and over the edge of the substrate).

Display mesh wire(s) 24 can cover, for example, at least 25%, at least 50%, at least 75%, or at least 90% of a display area 20 between light-controlling elements 40. In some embodiments of the present invention, one or more display mesh wires 24 is a row wire 12 extending in a row direction across a display area 20, one or more display mesh wires 24 is a column wire 14 extending in a column direction different from the row direction across a display area 20, or both one or more display mesh wires 24 is a row wire 12 and one or more display mesh wires 24 is a column wire 14. In some embodiments, at least one row wire 12 is a display mesh wire 24, at least one column wire 14 is a display mesh wire 24, or both a row wire 12 and a column wire 14 are display mesh wires 24. In some embodiments, only row wire(s) 12 or only column wire(s) 14 are display mesh wires 24. Row and column wires 12, 14 can be provided on different layers of a display substrate 10 to avoid shorts in a matrix-addressed pixel structure of a transparent display 99. In some embodiments, power or ground wires 46, 48 in a display area 20, or both power and ground wires 46, 48, are display mesh wires 24.

In some embodiments of the present invention, micro-LEDs 44 and a pixel controller 42 are disposed directly on a display substrate 10. In some embodiments, referring to FIG. 12 for example, components of a pixel 50, for example including a pixel controller 42 and light-controlling elements 40, for example micro-LEDs 44, are disposed on a pixel substrate 56 and the pixel substrate 56 is disposed on a display substrate 10. In FIG. 12, a pixel controller 42 is provided in a separate integrated circuit on the pixel substrate 56, for example micro-transfer printed from a native source wafer to the non-native pixel substrate 56 and electrically connected with fine, high-resolution pixel wires 19. Relatively high-resolution pixel wires 19 can be electrically connected to relatively low-resolution display wires 22 on a display substrate 10. In some embodiments, a pixel substrate 56 is a semiconductor substrate and a pixel controller 42 is provided in a circuit formed in or on the pixel substrate 56, so that the pixel controller 42 is native to the pixel substrate 56 and electrically connected with fine, high-resolution pixel wires 19.

Figure 13:
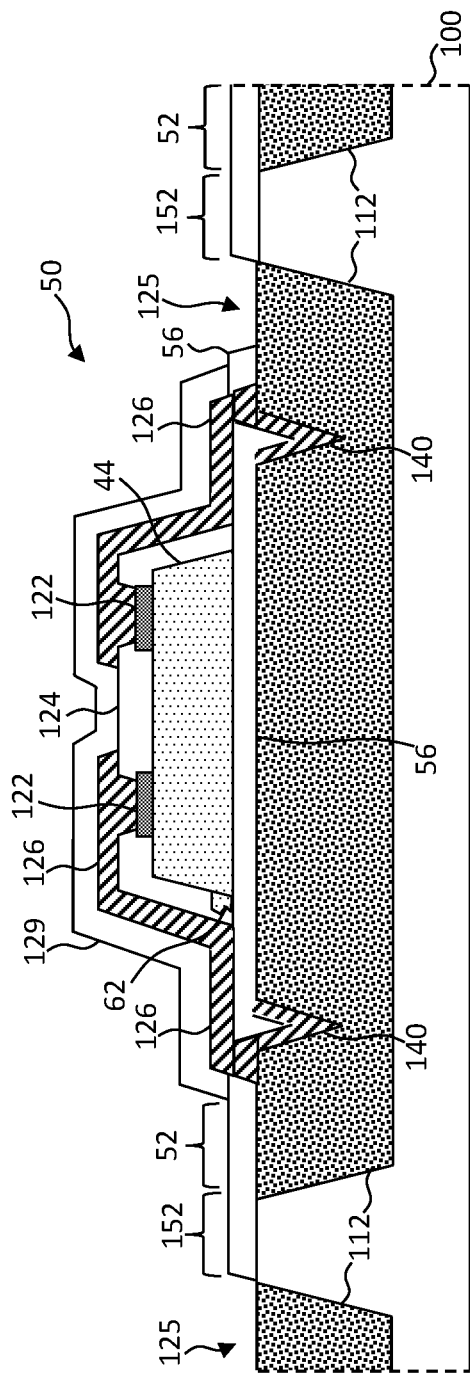
FIG. 13 is a cross section illustrating a micro-transfer printable pixel of a pixel source wafer, according to exemplary embodiments of the present invention.

Certain embodiments of the present invention can be constructed by micro-transfer printing devices, such as micro-controllers 42 and light-emitting diodes 44, from respective source wafers to a display substrate 10. Referring to FIGS. 12 and 13, in some embodiments of the present invention, two or more light-controlling elements 40 are disposed on a pixel substrate 56 and the pixel substrate 56 is disposed in a display area 20 of a display substrate 10, for example by micro-transfer printing devices in the light-controlling elements 40, such as micro-controllers 42 and light-emitting diodes 44, from respective source wafers to a pixel substrate 56 on a pixel source wafer 100 (as shown in FIG. 13 where only one LED is visible in the cross-section), and then micro-transfer printing the pixel substrates 56 from the pixel source wafer 100 to a display area 20 of a display substrate 10. The components on the pixel substrate 56 can be electrically connected with pixel wires 19 that are electrically connected to display wires 22 on the display substrate 10 to control the pixel controller 42 and micro-LEDs 44. A pixel substrate 56 can, for example, be similar to a display substrate 10 (e.g. made of glass or plastic) but in a much smaller size, for example having an area of 10-50 square microns, 50-100 square microns, 100-500 square microns, or 500 square microns-1 square mm and can be only a few microns thick, for example 1-5 microns, 5-10 microns, 10-20 microns, or 20-50 microns thick.

Micro-transfer printing has the advantage of using a crystalline silicon substrate for a pixel controller 42 that provides, smaller higher-performance integrated circuit components than can be made in the amorphous or poly-silicon semiconductor available on a large substrate such as a pixel substrate 56 or display substrate 10. In some such embodiments, a display substrate 10 can include material, for example glass or plastic, different from a material in the semiconductor substrate, for example a semiconductor material such as silicon or a compound semiconductor. Such arrangements also have an advantage in that pixels 50 can be separately tested before they are located on the surface of a display substrate 10, thus improving yields and reducing costs.

In some embodiments of the present invention, components (e.g., light-controlling elements 40, pixels 50, LEDs 44, or controllers 42) are physically connected to a source wafer with one or more tethers that hold the components in place with respect to the source wafer so that the components can be micro-transfer printed from the source wafer, for example by contacting the components with respective posts of a transfer stamp to adhere the components to the stamp posts and then removing the transfer stamp from the source wafer, thereby breaking (e.g., fracturing) or separating the tethers. The components are then contacted to and adhered to a destination substrate, such as a display substrate 10 or pixel substrate 56 and the transfer stamp removed. FIG. 12 illustrates broken (e.g., fractured) micro-LED tethers 62 resulting from micro-transfer printing red, green, and blue micro-LEDs 44R, 44G, 44B from respective LED source wafers each comprising different materials, for example GaN and GaAs, that are suitable for making LEDs that emit light of different colors. FIG. 12 also illustrates broken (e.g., fractured) micro-controller tethers 54 resulting from micro-transfer printing micro-controllers 42 from a micro-controller source wafer, for example a CMOS integrated circuit. Referring to FIG. 13, the pixel 50 itself (light-controlling element 40, in this case an active-matrix three-color pixel 50) is formed on a pixel substrate 56 on a pixel source wafer 100 and can be micro-transfer printed from the pixel source wafer 100 to a destination substrate, such as a display substrate 10, thereby breaking (e.g., fracturing) or separating pixel tethers 52 attached to the pixel substrate 56.

Referring to FIG. 13, one or more pixels 50, for example an array of pixels 50 are provided on a pixel source substrate 100 having a plurality of sacrificial portions 112 separated by anchors 152, for example transversely or laterally separated. Each pixel 50 is disposed entirely over a corresponding sacrificial portion 112 and can include, for example one or more electrically connected components such as micro-LEDs 44 (e.g., micro-LEDs 44R, 44G, 44B) and a micro-controller 42, with broken micro-LED and controller tethers 62, 54, as illustrated in FIGS. 12 and 13. The components can be protected with patterned dielectric material 124 and electronically connected with contact pads 122 and patterned electrodes 126 connected to connection posts 140. Dielectric material forming an encapsulation layer 129 protects the components and can form a pixel tether 52 physically connecting the pixel 50 to an anchor 152. A sacrificial portion 112 can be etched through an opening 125 to release a pixel 50 from a pixel source substrate 100, except for the pixel tether 52. The pixel 50 can then be micro-transfer printed by pressing a stamp post against the pixel 50 to adhere the pixel 50 to the stamp post and removing the transfer stamp to fracture the pixel tether 52. The transfer stamp is moved to a display substrate 10 and the pixel 50 adhered to the display substrate 10, for example by pressing the connection posts 140 into an electrical contact on the display substrate 10.

According to some embodiments of the present invention, micro-light emitting diodes 44 can be organic or inorganic light-emitting diodes 44. Each light-emitting diode can have at least one of a width from 2 to no more than 5 μm, 5 to no more than 10 μm, 10 to no more than 20 μm, or 20 to no more than 50 μm, a length from 2 to no more than 5 μm, 5 to no more than 10 μm, 10 to no more than 20 μm, or 20 to no more than 50 μm, and a thickness from 2 to no more than 5 μm, 4 to no more than 10 μm, 10 to no more than 20 μm, or 20 to no more than 50 μm. U.S. Pat. No. 6,825,559 describes methods of making micro-transfer-printable inorganic micro-LEDs 44, the disclosure of which are hereby incorporated by reference.

Referring to FIG. 14, a high-aspect ratio display wire 22 having a depth 74 that is greater than a width 72 (e.g., with a depth to width aspect ratio of at least 1.5, at least 2, at least 3, or at least 5) is formed by coating a display support 11 with a curable dielectric layer that is imprinted with an imprinting stamp and cured to form a cured dielectric layer 13 of the display substrate 10. The imprinting stamp is removed and a liquid conductive ink is coated over the cured dielectric layer 13 and in the imprinted structures of the cured dielectric layer 13, excess liquid conductive link is removed from the surface of the cured dielectric layer 13 (for example by scraping with a doctor blade), and the conductive ink is cured to form a cured wire 15 in the imprinted structures of the cured dielectric layer 13. The liquid conductive ink can include solids such as conductive nano-particles. The imprinting stamp that imprints the curable dielectric layer can have imprinting structures with any of a wide variety of perimeter cross section shapes, for example rectangular as shown in FIG. 14, trapezoidal, as shown in FIG. 15), or triangular, as shown in FIG. 16. A high-aspect-ratio cured wire 15 that, optionally, has a non-rectangular perimeter with a depth greater than a height, as shown, can have improved transparency and conductivity because the increased depth of the cured wire 15 provides an increased cross section reducing the cured wire 15 resistance without obscuring more light passing orthogonally through the display substrate 10. A high-aspect-ratio cured wire 15 that has a bottom surface area 72 that is smaller than an opposing top surface area 70, as shown in FIGS. 15 and 16, can have improved transparency at viewing angles non-orthogonal to a surface of a display substrate 10.

Thus, according to some embodiments of the present invention, a transparent display 99 comprises a display substrate 10 having a display area 20 within which information can be displayed. The display substrate 10 is at least partially transparent. Light-controlling elements 40 are disposed in, on, or over the display substrate 10 in the display area 20. The light-controlling elements 40 are spaced apart in, on, or over the display substrate 10 in a regular two-dimensional array. Display wires 22 are disposed in, on, or over the display substrate 10 in the display area 20. The display wires 22 are electrically connected to the light-controlling elements 40 and are spaced apart in, on, or over the display substrate 10 in a regular array. The thickness (depth 74) of a display wire 22 is greater than the width of the display wire 22 (e.g., with a depth to width aspect ratio of at least 1.5, at least 2, at least 3, or at least 5). According to some embodiments of the present invention, the display wires 22 (or bezel wires 32, or both) have a rectangular, triangular, or trapezoidal cross section.

In some embodiments of the present invention, light-controlling elements 40 can emit light in a direction opposite to or away from a display substrate 10 so that most or all of the emitted light does not pass or is not transmitted through the display substrate 10 (in a top-emitter configuration). In some embodiments of the present invention, light-controlling elements 40 can emit light in a direction towards a display substrate 10 so that most or all of the emitted light passes through the display substrate 10 (in a bottom-emitter configuration).

As shown in FIGS. 1 and 5, light-controlling elements 40, for example inorganic micro-LEDs 44 can be organized and controlled in groups of pixels 50, each of which comprises one or more inorganic micro-LEDs 44. The inorganic micro-LEDs 44 in a pixel 50 can include inorganic micro-LEDs 44 that emit different colors of light, for example red light from red-light emitting diode 44R, green light from green-light emitting diode 44G, and blue light from blue-light emitting diode 44B (collectively micro-LEDs 44). In certain embodiments of the present invention, a transparent display 99 is a matrix-addressed transparent display 99 having row-select and column-data lines (e.g., row wires 12 and column wires 14). Each light-controlling element 40 is controlled by a row-select line in combination with a column-data line. In some embodiments, a transparent display 99 is a passive-matrix display. In some embodiments, a transparent display 99 is an active-matrix display having a pixel controller 42 with a control circuit 43 provided for each pixel 50. A pixel controller 42 is disposed in, on, or over a display substrate 10 in association with one or more micro-LEDs 44 in the pixel 50 and is electrically connected with display wires 22 to the one or more micro-LEDs 44 to control the one or more micro-LEDs 44 using signals provided on the display wires 22.

Display wires 22 can be provided in two or more metal layers on or in the display substrate 10 to avoid electrical short circuits and can be electrically connected to display substrate contact pads or other electrical connections suitable for connecting to display control circuits (not shown). In some embodiments, row- or column-control circuits can be provided on the display substrate 10, for example around the periphery of the display substrate 10 and external to the display area 20.

In certain embodiments, in operation, a display controller (not shown in the Figures) provides signals, such as power, ground, and control signals, through display wires 22, including row and column wires 12, 14, to the pixels 50 to cause the light-controlling elements 40 to control light at each pixel 50, thereby displaying information, such as images, in the display area 20 of the transparent display 99.

Certain embodiments of the present invention comprise LED light-emitters, for example micro-LEDs 44, that enable a relatively small aperture ratio and a substantially transparent display 99, for example greater than or equal to 50%, 70%, 80%, 90%, or 95% transparent to visible light. In various embodiments, the combined area of the micro-LEDs 44 light-emitting area or the micro-LEDs 44 themselves is less than or equal to 25%, 10%, 5%, 2%, 1%, 0.5%, 0.1%, 0.05%, or 0.01% of the display area 20 or the minimum contiguous convex display area 20 including all of the micro-LEDs 44 on a display substrate 10. For example, micro-LEDs 44 have been constructed having a size of 8×15 µm and area of 120 µm². For example, a 4 k×2 k full color display can have 4096×2048×3 LEDs 22 (each having an area of 120 µm²) equaling a total micro-LED 44 area of 3020 mm². A transparent display 99 having a display substrate 10 one meter high by two meters long has an area of two square meters or 2,000,000 mm², so that only 3020/2,000,000=0.15% of the display substrate 10 area is covered with the micro-LEDs 44. An exemplary 8 k×4 k display of the same size with same-sized micro-LEDs 44 will still have less than 1% of the display substrate 10 area covered by micro-LEDs 44.

Structures and elements in accordance with certain embodiments of the present invention can be made and assembled using micro-transfer printing methods and materials. In some embodiments, micro-LEDs 44 are prepared on a native source wafer, for example a sapphire wafer with compound semiconductors such as GaN thereon, each type of micro-LED 44 prepared on a different source wafer and released for micro-transfer printing with one or more micro-LED tethers 62 (shown in FIGS. 12 and 13) physically connecting the micro-LEDs 44 to an anchor portion of the source wafer. Any pixel controller 42 provided in a separate integrated circuit, for example comprising silicon CMOS circuits, can similarly be prepared on a source wafer such as a silicon wafer. In certain embodiments, micro-LEDs 44 and any pixel controller 42 components are then contacted with a micro-transfer printing stamp to fracture or otherwise break the micro-LED tethers 62 and controller tethers 54 and adhere the components to the transfer stamp, the transfer stamp is transferred to a non-native destination substrate such as the display substrate 10, and the components are contacted and adhered to the destination substrate. A different micro-transfer printing step can be used with each different source wafer. When micro-transfer printing components directly from the source wafers to the destination substrate (e.g., display substrate 10), each micro-transfer printed component will have a substrate and form a broken (e.g., fractured) micro-LED or controller tether 62, 54 such as that shown in FIG. 12. If, as in some embodiments, components are first micro-transfer printed to non-native pixel substrates 56 (FIG. 12), the pixel substrates 56 themselves can be micro-transfer printed to a non-native destination substrate such as a display substrate 10 using the same released structure with a pixel tether 52 and micro-transfer printing process.

According to various embodiments of the present invention, a transparent display 99 includes a variety of designs having a variety of resolutions, micro-LED 44 sizes, and display substrate 10 and display area 20 sizes. For example, embodiments with display substrates 10 ranging from about 1 cm by 1 cm to about 10 m by 10 m in size are contemplated. Inorganic light-emitting diodes 44 can be micro-LEDs 44 and, in some embodiments, can have a size of one square micron to 500 square microns (e.g., at least one of a height, from 2 to no more than 5 µm, 5 to no more than 10 µm, 10 to no more than 20 µm, or 20 to no more than 50 µm, a length from 2 to no more than 5 µm, 5 to no more than 10 µm, 10 to no more than 20 µm, or 20 to no more than 50 µm, and a width from 2 to no more than 5 µm, 5 to 10 no more than µm, or 10 to no more than 20 µm, or 20 to no more than 50 µm). In general, larger inorganic LEDs 44 are most useful, but are not limited to, larger display substrates 10. The resolution of micro-LEDs 44 over a display substrate 10 can also vary, for example from 50 of micro-LEDs 44 per inch to hundreds of micro-LEDs 44 per inch, or even thousands of micro-LEDs 44 per inch. For example, a three-color display having one thousand 10 µm×10 µm micro-LEDs 44 per inch (on a 25-µm pitch) has an aperture ratio of less than 16 percent (including only the area of micro-LEDs 44). Thus, certain embodiments of the present invention have application in both low-resolution and very high-resolution transparent displays 99.

According to certain embodiments of the present invention, a display substrate 10 can include layers formed on an underlying structure or substrate, for example a rigid or flexible glass or plastic substrate. In some embodiments, micro-LEDs 44 are formed in a layer on a display substrate 10 so that the micro-LEDs 44 are native to the display substrate 10. In some embodiments, micro-LEDs 44 are transferred from another substrate (such as a semiconductor source wafer) to a display substrate 10 so that the micro-LEDs 44 are non-native to the display substrate 10.

In some embodiments of the present invention, micro-LEDs 44 have light-emissive areas or a size of less than 10, 20, 50, or 100 square microns. In some embodiments, micro-LEDs 44 have at least one of a height from 2 to no more than 5 µm, 5 to no more than 10 µm, 10 to no more than 20 µm, or 20 to no more than 50 µm, a length from 2 to no more than 5 µm, 5 to no more than 10 µm, 10 to no more than 20 µm, or 20 to no more than 50 µm, and a width from 2 to no more than 5 µm, 5 to no more than 10 µm, 10 to no more than 20 µm, or 20 to no more than 50 µm. Such micro-LEDs 44 have the advantage of a small light-emissive area compared to their brightness as well as color purity providing highly saturated display colors and a substantially Lambertian emission providing a wide viewing angle for a transparent display 99 according to certain embodiments of the present invention. In various embodiments, a display area 20 of a display substrate 10 is greater than or equal to eight times, ten times, twenty times, fifty times, one hundred times, two hundred times, five hundred times, one thousand, or ten thousand times the combined light-emissive areas of the micro-LEDs 44 or the areas of the micro-LEDs 44.

Certain embodiments of the present invention can be operated in a variety of useful ways. In some embodiments, a display controller provides power, a ground reference, and control signals to pixels 50 in a transparent display 99 of the present invention through the display wires 22. The control signals can provide a passive-matrix control of light-controlling elements 40 in pixels 50 to provide functionality to a transparent display 99. In some embodiments, pixels 50 include a pixel controller 42. A display controller is connected to pixel controllers 42 through display wires 22 and provides control signals for operating light-controlling elements 40, for example in an active-matrix control configuration. In some embodiments, a pixel controller 42 includes analog, digital, or mixed-signal circuitry and can control micro-LEDs 44 in response to a display controller to emit light in an image-wise fashion in the display area 20, for example displaying images, graphics, text, or other information.

Display wires 22 can be formed on a display substrate 10 using photolithographic processing techniques, for example photolithographic processes employing metal or metal oxide deposition using evaporation or sputtering, curable resin coatings (e.g., SU8), positive or negative photo-resist coating, radiation (e.g., ultraviolet radiation) exposure through a patterned mask, and etching methods to form patterned metal structures, vias, insulating layers, and electrical interconnections. Inkjet and screen-printing deposition processes and materials can be used to form patterned conductors or other electrical elements, as can substrate imprinting techniques with conductive inks.

Pixel wires 19 can be fine interconnections, for example having a width of less than 50 µm, less than 20 µm, less than 10 µm, less than five µm, less than two µm, or less than one µm. Display wires 22 can include one or more crude lithography interconnections having a width from 2 µm to 2 mm. In some embodiments, fine interconnections (pixel wires 19) are provided on pixel substrates 56 using relatively high-resolution photolithographic methods and materials and coarse interconnections (display wires 22) are provided on a display substrate 10 using relatively low-resolution printed circuit board methods and materials.

For a discussion of micro-transfer printing techniques see, U.S. Pat. Nos. 8,722,458, 7,622,367 and 8,506,867, the disclosure of each of which is hereby incorporated by reference. In some embodiments, micro-LEDs 44 are electrically connected to display wires 22 on a display substrate 10 by a process of micro-transfer printing, using connection posts 140 formed with micro-LEDs 44 (shown in FIG. 13), as described in U.S. Pat. No. 8,889,485. In certain embodiments, transferred micro-LEDs 44, pixel controller 42, or pixel substrates 56 are interconnected to the display wires 22 on the display substrate 10 using photolithographic or printed circuit board materials and methods, to enable the display controller to electrically interact with the micro-LEDs 44 to emit light in a transparent display 99. In an exemplary process, transfer or construction of micro-LEDs 44 is performed before or after all the display wires 22 are in place. Thus, in some embodiments, construction of display wires 22 can be performed before the micro-LEDs 44 are printed or after the micro-LEDs 44 are printed. In some embodiments, a display controller is externally located (for example on a separate printed circuit board substrate) and electrically connected to the display wires 22 using connectors, ribbon cables, or the like. Alternatively, in some embodiments, a display controller is affixed to a display substrate 10 outside a display area 20 and electrically connected to display wires 22 using wires and buses, for example using surface mount and soldering technology (not shown).

Methods of forming micro-transfer printable structures are described, for example, in the paper "AMOLED Displays using Transfer-Printed Integrated Circuits" (Journal of the Society for Information Display, 2011, DOI #10.1889/JSID19.4.335, 1071-0922/11/1904-0335, pages 335-341) and U.S. Pat. No. 8,889,485, referenced above. For a discussion of micro-transfer printing techniques see, U.S. Pat.

Nos. 8,722,458, 7,622,367, and 8,506,867, the disclosure of each of which is hereby incorporated by reference in its entirety. Micro-transfer printing using compound micro-assembly structures and methods can also be used with certain embodiments of the present invention, for example, as described in U.S. patent application Ser. No. 14/822,868, filed Aug. 10, 2015, entitled Compound Micro Assembly Strategies and Devices, the disclosure of which is hereby incorporated by reference in their entirety. Additional details useful in understanding and performing aspects of the present invention are described in U.S. patent application Ser. No. 14/743,981, filed Jun. 18, 2015, entitled Micro Assembled LED Displays and Lighting Elements, the disclosure of which is hereby incorporated by reference in their entirety.

As is understood by those skilled in the art, the terms "over", "under", "above", "below", "beneath", and "on" are relative terms and can be interchanged in reference to different orientations of the layers, elements, and substrates included in the present invention. For example, a first layer on a second layer, in some embodiments means a first layer directly on and in contact with a second layer. In other embodiments, a first layer on a second layer can include another layer there between. Furthermore, the designations of "row" or "column" with respect to matrix addressing are arbitrary and can be exchanged.

Having described certain embodiments, it will now become apparent to one of skill in the art that other embodiments incorporating the concepts of the disclosure may be used. Therefore, the invention should not be limited to the described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST 10 display substrate
11 display support
12 row wire
13 cured dielectric layer
14 column wire
15 high-aspect-ratio cured wire
16 display unit area
18 bezel unit area
19 pixel wire/fine wire
20 display area
22 display wire/coarse wire
24 display mesh wire
30 bezel area
32 bezel wire
33 mesh bezel wire
34 bezel wire width
35 individual mesh wire
36 bezel wire spacing
37A bezel wire spacing
37B bezel wire spacing
40 light-controlling element
42 micro-controller/pixel controller
43 control circuit
44 light-emitting diode (LED)/micro-LED
44R red-light-emitting diode
44G green-light-emitting diode
44B blue-light-emitting diode
46 power wire
48 ground wire
50 pixel
52 pixel tether
54 controller tether
56 pixel substrate
62 micro-LED tether
70 top surface area
72 bottom surface area
74 depth
76 width
99 transparent display
100 pixel source substrate/wafer
112 sacrificial portion
122 contact pad
124 patterned dielectric material
125 opening
126 electrode
129 encapsulation layer/dielectric layer
140 connection posts
152 anchor

What is claimed:

1. A transparent display, comprising:
a display substrate having a display area within which information can be displayed and a bezel area adjacent to each of at least one corresponding side of the display area, wherein the display substrate is at least partially transparent;
light-controlling elements disposed in, on, or over the display substrate in the display area;
display wires disposed in, on, or over the display substrate in the display area, the display wires electrically connected to the light-controlling elements; and
bezel wires disposed in, on, or over the display substrate in the bezel area, the bezel wires electrically connected to respective ones of the display wires,
wherein bezel wires disposed farther from the display area are (i) spaced farther apart than bezel wires disposed closer to the display area, (ii) narrower than bezel wires disposed closer to the display area, or (iii) both (i) and (ii), such that the transparent display has a bezel transparency that varies over the bezel area.

2. The transparent display of claim 1, wherein the transparent display has a greater transparency in portions of the bezel area that are farther away from the display area and a lesser bezel transparency in portions of the bezel area that are closer to the display area.

3. The transparent display of claim 1, wherein one or more of the bezel wires are mesh wires comprising individual wires.

4. The transparent display of claim 3, wherein the individual wires in each mesh wire disposed farther from the display area are narrower than individual wires in mesh wires that are closer to the display area or wherein individual wires in mesh wires disposed farther from the display area are spaced farther apart than individual wires in mesh wires that are closer to the display area.

5. The transparent display of claim 3, wherein individual wires in a mesh wire have a variable spacing.

6. The transparent display of claim 1, wherein two or more of the light-controlling elements are disposed on a pixel substrate, and the pixel substrate is disposed on the display substrate in the display area.

7. The transparent display of claim 6, wherein the pixel substrate is micro-transfer printed onto the display substrate in the display area, and the pixel substrate comprises a broken or separated tether.

8. The transparent display of claim 1, wherein the light-controlling elements are inorganic light-emitting diodes.

9. The transparent display of claim 8, wherein each inorganic light-emitting diode has at least one of a width from 2 to no more than 5 μm, 5 to no more than 10 μm, 10 to no more than 20 μm, or 20 to no more than 50 μm, a length from 2 to no more than 5 μm, 5 to no more than 10 μm, 10 to no more than 20 μm, or 20 to no more than 50 μm, and a thickness from 2 to no more than 5 μm, 4 to no more than 10 μm, 10 to no more than 20 μm, or 20 to no more than 50 μm.

10. The transparent display of claim 8, wherein the light-emitting diodes are micro-transfer printed light-emitting diodes each comprising a broken or separated tether.

11. The transparent display of claim 1, wherein the bezel wires are spaced apart by a bezel wire spacing that is greater than a width of the bezel wires.

12. The transparent display of claim 11, wherein the bezel wire spacing is at least twice the width of the bezel wires.

13. The transparent display of claim 1, wherein, for each of the display wires, a depth of the display wire is greater than a width of the display wire.

14. The transparent display of claim 13, wherein the display wire has a bottom surface area that is smaller than an opposing top surface area.

15. The transparent display of claim 13, wherein the display wire has a triangular or trapezoidal cross section.

16. The transparent display of claim 13, wherein a depth to width aspect ratio of the display wire is at least 1.5.

17. The transparent display of claim 16, wherein the depth to width aspect ratio is at least 3.

18. The transparent display of claim 1, wherein bezel wires disposed farther from the display area are spaced farther apart than bezel wires disposed closer to the display area.

19. The transparent display of claim 1, wherein bezel wires disposed farther from the display area are narrower than bezel wires disposed closer to the display area.

20. The transparent display of claim 1, wherein bezel wires disposed farther from the display area are (i) narrower than bezel wires disposed closer to the display area and (ii) spaced farther apart than bezel wires disposed closer to the display area.

* * * * *